(12) United States Patent
Harada et al.

(10) Patent No.: US 6,511,787 B2
(45) Date of Patent: Jan. 28, 2003

(54) POLYMERS, RESIST COMPOSITIONS AND PATTERNING PROCESS

(75) Inventors: Yuji Harada, Nakakubiki-gun (JP); Jun Hatakeyama, Nakakubiki-gun (JP); Jun Watanabe, Nakakubiki-gun (JP); Yoshio Kawai, Nakakubiki-gun (JP); Masaru Sasago, Hirakata (JP); Masayuki Endo, Izumi (JP); Shinji Kishimura, Itami (JP); Michitaka Ootani, Kawagoe (JP); Satoru Miyazawa, Kawagoe (JP); Kentaro Tsutsumi, Kawagoe (JP); Kazuhiko Maeda, Chiyoda (JP)

(73) Assignees: Shin-Etsu Chemical Co., Ltd., Tokyo (JP); Matsushita Electric Industrial Co., Ltd., Osaka (JP); Central Glass Co., Ltd., Yamaguchi-ken (JP)

( * ) Notice: Subject to any disclaimer, the term of this patent is extended or adjusted under 35 U.S.C. 154(b) by 0 days.

(21) Appl. No.: 09/947,764

(22) Filed: Sep. 7, 2001

(65) Prior Publication Data

US 2002/0048724 A1 Apr. 25, 2002

(30) Foreign Application Priority Data

Sep. 7, 2000 (JP) .......................................... 2000-271234

(51) Int. Cl.$^7$ .......................... G03F 7/004; C08F 214/18

(52) U.S. Cl. ..................... 430/270.1; 430/326; 430/907; 430/910; 526/242; 526/319

(58) Field of Search ............................. 430/270.1, 326, 430/910, 907; 526/242, 319

(56) References Cited

U.S. PATENT DOCUMENTS

| 4,822,721 | A | * | 4/1989 | Tsutsumi et al. | ............ 430/325 |
| 5,142,009 | A | * | 8/1992 | Kawaguchi | .................. 526/245 |
| 6,379,874 | B1 | * | 4/2002 | Ober et al. | .................. 430/322 |
| 6,433,118 | B1 | * | 8/2002 | Fukuda et al. | ........... 526/328.5 |

FOREIGN PATENT DOCUMENTS

| JP | A 63-27829 | 2/1988 |
| JP | B 2-27660 | 6/1990 |
| JP | A 9-73173 | 3/1997 |
| JP | A 9-230595 | 9/1997 |
| JP | A 10-10739 | 1/1998 |
| WO | WO 97/33198 | 9/1997 |

* cited by examiner

*Primary Examiner*—Rosemary Ashton
(74) *Attorney, Agent, or Firm*—Millen, White, Zelano & Branigan, P.C.

(57) ABSTRACT

An acrylic resin containing hexafluoroisopropanol units has high transmittance to VUV radiation. A resist composition using the resin as a base polymer has high transparency, substrate adhesion, alkali developability and acid-elimination capability and is suited for lithographic microprocessing.

7 Claims, No Drawings

POLYMERS, RESIST COMPOSITIONS AND PATTERNING PROCESS

This invention relates to polymers useful as the base resin in chemical amplification resist compositions suited for microfabrication. It also relates to chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, acid-catalyzed chemical amplification positive working resist materials are effective as disclosed in U.S. Pat. Nos. 4,491,628 and 5,310,619 (JP-B 2-27660 and JP-A 63-27829). They now become predominant resist materials especially adapted for deep UV lithography. Also, the change-over from i-line (365 nm) to shorter wavelength KrF laser (248 nm) brought about a significant innovation. Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated.

For ArF laser (193 nm), it is expected to enable miniaturization of the design rule to 0.13 μm or less. Since conventionally used novolac resins and poly(vinyl phenol) resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-0739, JP-A 9-230595 and WO 97/33198.

With respect to $F_2$ excimer laser (157 nm) which is expected to enable further miniaturization to 0.10 μm or less, more difficulty arises in insuring transparency because it was found that acrylic resins which are used as the base resin for ArF are not transmissive to light at all and those cycloolefin resins having carbonyl bonds have strong absorption. It was also found that poly(vinyl phenol) which is used as the base resin for KrF has a window for absorption in proximity to 160 nm, so the transmittance is somewhat improved, but far below the practical level.

SUMMARY OF THE INVENTION

An object of the invention is to provide a novel polymer having a high transmittance to vacuum ultraviolet radiation of up to 300 nm, especially $F_2$ excimer laser beam (157 nm), $Kr_2$ excimer laser beam (146 nm), KrAr excimer laser beam (134 nm) and $Ar_2$ excimer laser beam (126 nm), and useful as the base resin in a chemical amplification resist composition. Another object is to provide a chemical amplification resist composition comprising the polymer, and a patterning process using the same.

It has been found that using as the base polymer an acrylic resin comprising hexafluoroisopropanol units, a resist material featuring high transparency, substrate adhesion, alkali developability and acid-elimination capability is obtained.

In a first aspect, the invention provides a polymer comprising recurring units of at least one of the following general formulae (1a), (1b) and (1c).

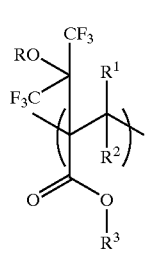

(1a)

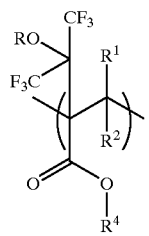

(1b)

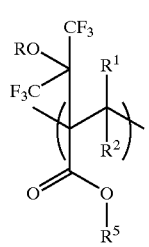

(1c)

Herein R is selected from the group consisting of hydrogen, an acid labile group, straight, branched or cyclic alkyl or fluorinated alkyl group of 1 to 20 carbon atoms, acyl group, and acyl group having a fluorinated alkyl moiety, $R^1$ and $R^2$ each are a hydrogen or fluorine atom, $R^3$ is an acid labile group, $R^4$ is an adhesive group, and $R^5$ is a straight, branched or cyclic alkyl or fluorinated alkyl group of 1 to 20 carbon atoms.

In a second aspect, the invention provides a resist composition comprising the polymer defined above.

Also provided is a chemically amplified, positive resist composition comprising (A) the polymer defined above, (B) an organic solvent, and (C) a photoacid generator. The resist composition may further include (D) a basic compound and/or (E) a dissolution inhibitor.

In a third aspect, the invention provides a process for forming a resist pattern comprising the steps of applying the resist composition onto a substrate to form a coating; heat treating the coating and then exposing it to high-energy radiation in a wavelength band of 110 to 180 nm or 1 to 30 nm through a photo mask; and optionally heat treating the exposed coating and developing it with a developer. Preferably, the high-energy radiation is an $F_2$ excimer laser beam, $Ar_2$ excimer laser beam or soft x-ray.

For improving the transmittance in proximity to 157 nm, reducing the number of carbonyl groups and/or carbon-to-carbon double bonds is contemplated to be one effective way. It was also found that introducing fluorine atoms into base polymers makes a great contribution to improved transmittance. In fact, poly(vinyl phenol) having fluorine introduced in its aromatic rings offers a transmittance nearly on a practically acceptable level. However, this base polymer was found to turn negative upon exposure to high-energy radiation as from an $F_2$ excimer laser, interfering with its use as a practical resist. In contrast, those polymers obtained by introducing fluorine into acrylic resins or polymers containing in their backbone an alicyclic compound originating from a norbornene derivative have been found to be suppressed in absorption and overcome the negative turning problem. Especially esters having hexafluoroisopropanol units introduced therein according to the present invention is improved in transmittance near 157 nm, substrate adhesion, and alkali developability as well as acid-elimination capability.

DESCRIPTION OF THE PREFERRED EMBODIMENT

Polymer

According to the invention, the polymers or high molecular weight compounds are defined as comprising recurring units of at least one of the following general formulas (1a), (1b) and (1c).

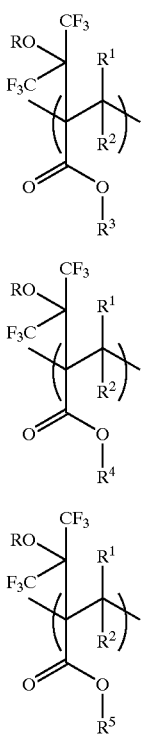

(1a)

(1b)

(1c)

Herein R is hydrogen, an acid labile group, straight, branched or cyclic alkyl or fluorinated alkyl group of 1 to 20 carbon atoms, acyl group, or acyl group having a fluorinated alkyl moiety, $R^1$ and $R^2$ each are a hydrogen or fluorine atom, $R^3$ is an acid labile group, $R^4$ is an adhesive group, and $R^5$ is a straight, branched or cyclic alkyl or fluorinated alkyl group of 1 to 20 carbon atoms.

In the recurring units of the above formulas, R is selected in order to control the dissolution rate of unexposed areas and the dissolution rate and swelling behavior of exposed areas, from among hydrogen, acid labile groups, straight, branched or cyclic alkyl or fluorinated alkyl groups of 1 to 20 carbon atoms, acyl groups, and acyl groups having a fluorinated alkyl moiety. One of these groups or a mixture of two or more of these groups may be selected as R.

The acid labile group represented by R may be any of the groups used as a blocking or protective group on phenols in prior art chemically amplified resist composition. Tertiary alkyloxycarbonyl and acetal groups are preferred. Exemplary tertiary alkyloxycarbonyl group include t-butoxycarbonyl and t-amyloxycarbonyl. Exemplary acetal groups include ethoxyethyl, ethoxypropyl, ethoxybutyl, ethoxyisobutyl, butoxyethyl, t-butoxyethyl, hexyloxyethyl, cyclohexyloxyethyl, benzyloxyethyl, benzyloxypropyl, phenethyloxyethyl, and phenethyloxypropyl. Also useful are the foregoing groups in which some or all hydrogen atoms in their alkyl moiety are substituted with fluorine atoms.

Examples of the straight, branched or cyclic $C_{1-20}$ alkyl groups represented by R and $R^5$ include methyl, ethyl, propyl, isopropyl, n-propyl, sec-butyl, tert-butyl, cyclopentyl, cyclohexyl, 2-ethylhexyl, n-octyl, phenyl, tricyclo[5,2,1,0$^{2,6}$]decylmethyl, tricyclo[5,2,1,0$^{2,6}$]decanyl, adamantyl, norbornyl, methylnorbornyl and isobornyl.

The fluorinated alkyl groups correspond to the foregoing alkyl groups in which some or all of the hydrogen atoms are substituted with fluorine atoms. Illustrative, non-limiting examples are given below.

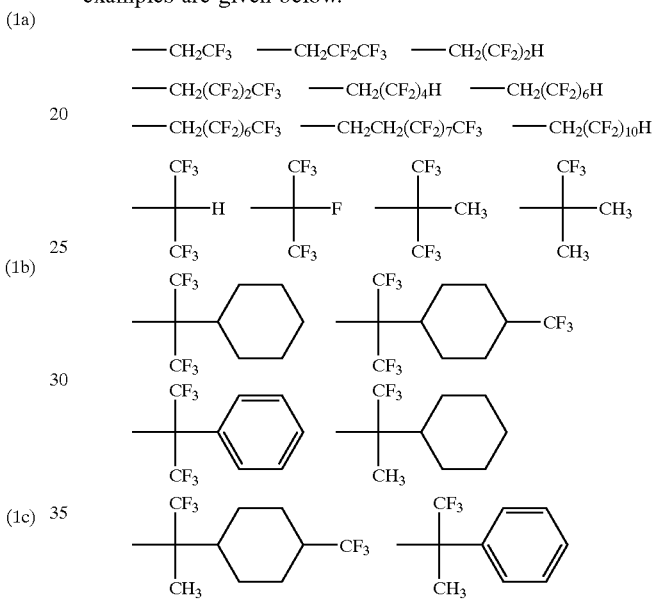

Examples of the acyl group represented by R include methylcarbonyl, ethylcarbonyl, propylcarbonyl, isopropylcarbonyl, butylcarbonyl, pivaloyl, pentylcarbonyl, cyclopentylcarbonyl, hexylcarbonyl and cyclohexylcarbonyl. Examples of the fluoroacyl group include trifluoromethyl-carbonyl, perfluoroethylcarbonyl, perfluoropropylcarbonyl, perfluoroisopropylcarbonyl, perfluorobutylcarbonyl, perfluoropivaloyl, perfluoropentylcarbonyl, perfluorocyclopentylcarbonyl, perfluorohexylcarbonyl and perfluorocyclohexylcarbonyl.

Next, the acid labile group represented by $R^3$ in formula (1a) is described. The acid labile group is selected from a variety of such groups, preferably from among groups of the following formulae (2) and (3), tertiary alkyl groups of 4 to 40 carbon atoms having the following formula (4), trialkylsilyl groups in which each alkyl has 1 to 6 carbon atoms, and oxyalkyl groups of 4 to 20 carbon atoms.

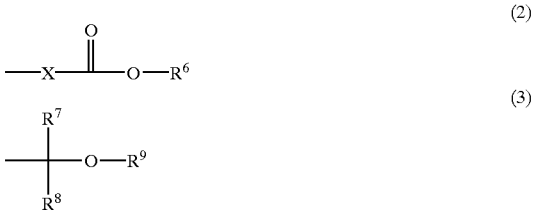

(2)

(3)

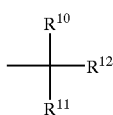
(4)

In formula (2), X is a divalent organic group, typically a straight, branched or cyclic alkylene group of 1 to 20 carbon atoms. Exemplary straight divalent organic groups include methylene, ethylene, propylene, and butylene. Exemplary branched divalent organic groups include methylmethylene, ethylmethylene, and propylmethylene. Exemplary cyclic divalent organic groups include cyclopentanediyl, cyclohexanediyl, phenylene, tricyclo-[5,2,1,0$^{2,6}$] decylmethyl, tricyclo[5,2,1,0$^{2,6}$]decanediyl, adamantanediyl, norbornanediyl, methylnorbornanediyl, and isobornanediyl. These organic groups may have fluorine atoms substituted for some or all of the hydrogen atoms thereon. $R^6$ is a trialkylsilyl group in which each alkyl moiety has 1 to 6 carbon atoms, or an organic group of formula (3) or (4), to be described later. Examples of the trialkylsilyl group include trimethylsilyl, triethylsilyl, dimethyl-tert-butylsilyl.

Illustrative examples of the acid labile groups of formula (2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

In formula (3), $R^9$ is a monovalent hydrocarbon group, typically a straight, branched or cyclic alkyl group of 1 to 20 carbon atoms, which may contain a hetero atom such as oxygen, sulfur, nitrogen or fluorine. $R^7$ and $R^8$ each are hydrogen or a straight, branched or cyclic alkyl group of 1 to 20 carbon atoms which may contain hetero atoms such as oxygen, sulfur, nitrogen or fluorine. A pair of $R^7$ and $R^8$, $R^7$ and $R^9$, and $R^8$ and $R^9$, taken together, may form a ring.

In more preferred embodiments of formula (3), $R^7$ to $R^9$ are as defined below.

$R^7$ and $R^8$ are hydrogen or straight, branched or cyclic alkyl groups of 1 to 18 carbon atoms, preferably 1 to 10 carbon atoms, for example, methyl, ethyl, n-propyl, isopropyl, n-butyl, sec-butyl, tert-butyl, cyclopentyl cyclohexyl, 2-ethylhexyl and n-octyl. $R^9$ is a monovalent hydrocarbon group of 1 to 18 carbon atoms, preferably 1 to 10 carbon atoms, which may contain a hetero atom such as oxygen, for example, straight, branched or cyclic alkyl groups and substituted ones of these alkyl groups in which some hydrogen atoms are substituted with hydroxyl, alkoxy, oxo, amino or alkylamino groups. Illustrative examples of such substituted alkyl groups are given below.

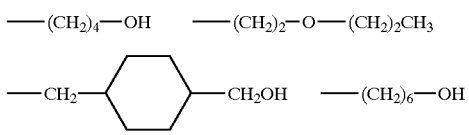

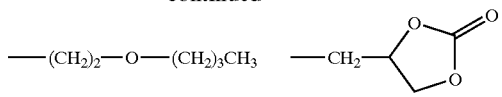

A pair of $R^7$ and $R^8$, a pair of $R^7$ and $R^9$, or a pair of $R^8$ and $R^9$, taken together, may form a ring. Each of $R^7$, $R^8$ and $R^9$ is a straight or branched alkylene group of 1 to 18 carbon atoms, preferably 1 to 10 carbon atoms when they form a ring.

Of the acid labile groups of formula (3), illustrative examples of the straight or branched groups are given below.

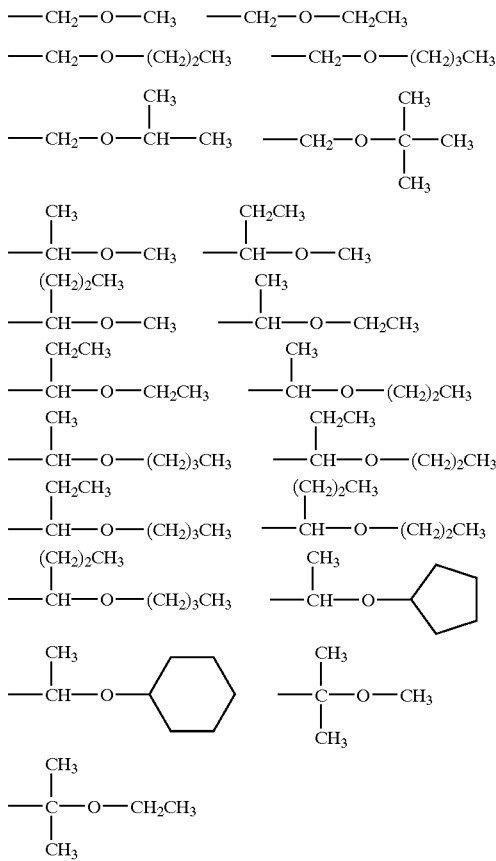

Of the acid labile groups of formula (3), illustrative examples of the cyclic groups include tetrahydrofuran-2-yl, 2-methyltetrahydrofuran-2-yl, tetrahydropyran-2-yl and 2-methyltetrahydropyran-2-yl. Preferred among the groups of formula (3) are ethoxyethyl, butoxyethyl and ethoxypropyl.

In formula (4), $R^{10}$, $R^{11}$ and $R^{12}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{10}$ and $R^{11}$, a pair of $R^{10}$ and $R^{11}$, or a pair of $R^{11}$ and $R^{12}$, taken together, may form a ring.

Examples of the tertiary alkyl group represented by formula (4) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (5) through (20).

(5) 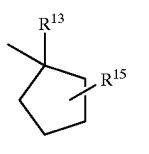

(6) 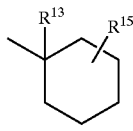

(7) 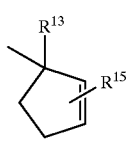

(8) 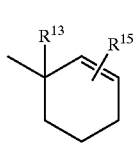

(9) 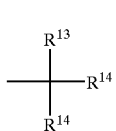

(10) 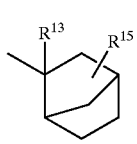

(11) 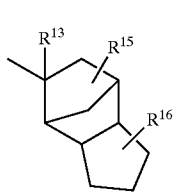

(12) 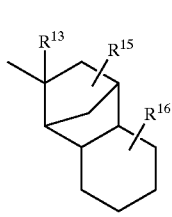

(13) 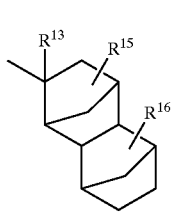

(14) 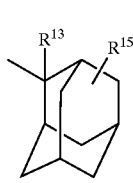

(15) 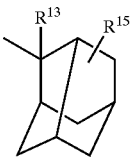

(16) 

(17) 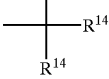

(18) 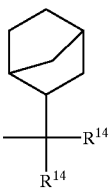

(19) 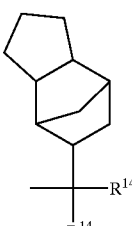

-continued

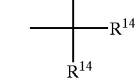

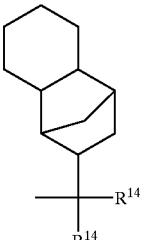

(20) 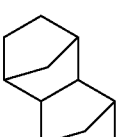

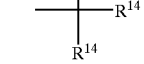

$R^{13}$ is a straight, branched or cyclic alkyl group of 1 to 6 carbon atoms, for example, methyl, ethyl, propyl, isopropyl, n-butyl, sec-butyl, n-pentyl, n-hexyl, cyclopropyl, cyclopropylmethyl, cyclobutyl, cyclopentyl and cyclohexyl.

$R^{14}$ is a straight, branched or cyclic alkyl group of 2 to 6 carbon atoms, for example, ethyl, propyl, isopropyl, n-butyl, sec-butyl, n-pentyl, n-hexyl, cyclopropyl, cyclopropylmethyl, cyclobutyl, cyclopentyl and cyclohexyl.

Each of $R^{15}$ and $R^{16}$ is hydrogen or a monovalent hydrocarbon group of 1 to 6 carbon atoms which may contain a hetero atom or a monovalent hydrocarbon group of 1 to 6 carbon atoms which may be separated by a hetero atom. The hetero atom is an oxygen, sulfur or nitrogen atom, which is contained or intervenes in the form of —OH, —OR, —O—, —S—, —S(=O)—, —NH$_2$, —NHR, —NR$_2$, —NH—, or —NR— wherein R is an alkyl group. Examples of R$^{15}$ and R$^{16}$ include hydrogen, alkyl, hydroxyalkyl, alkoxy, and alkoxyalkyl groups which may be straight, branched or cyclic. Illustrative are methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Next, the adhesive group represented by R$^4$ in formula (1b) is described. The adhesive group is selected from a variety of such groups, preferably from among the groups of the following formulae (21) through (48).

(21)
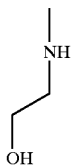

(22)
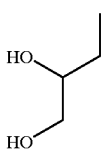

(23)
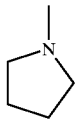

(24)
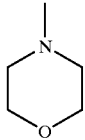

(25)
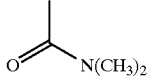

(26)
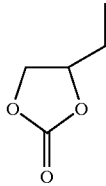

(27)
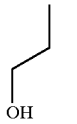

(28)
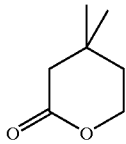

-continued

(29)
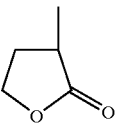

(30)

(31)
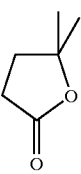

(32)
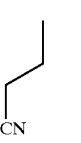

(33)

(34)
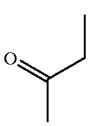

(35)

(36)
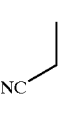

(37)
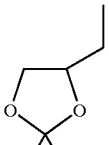

(38)
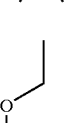

(39) 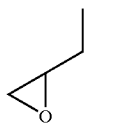

(40) 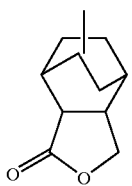

(41) 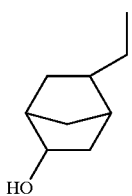

(42) 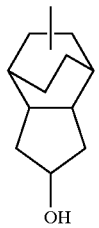

(43) 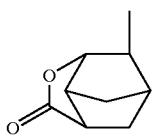

(44) 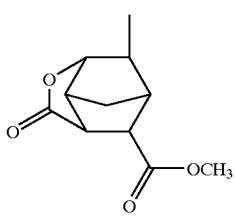

(45) 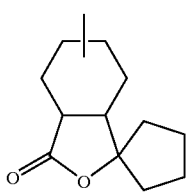

(46) 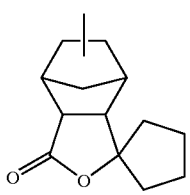

(47) 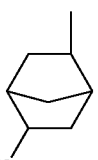

(48) 

According to the invention, polymers comprising recurring units of formula (1a), (1b) or (1c) alone may be used as the resist base resin. If desired, binary or ternary copolymers comprising recurring units of any two or three of formulae (1a), (1b) and (1c) in a varying compositional ratio may also be used as the resist base resin. Also useful are copolymers of specific recurring units with another monomer selected from conventional monomers used in prior art resist base resins. Often used are conventional monomers capable of introducing recurring units of formulae (1')-1 to (1')-5 shown below.

(1')-1 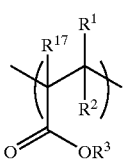

(1')-2 

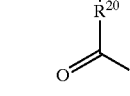

(1')-3 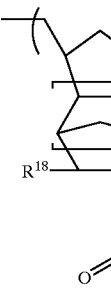

-continued (1')-4
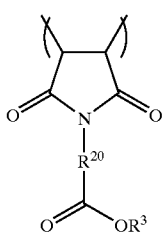

(1')-5
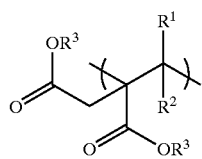

Herein, $R^1$, $R^2$, and $R^{17}$ are hydrogen, fluorine or straight, branched or cyclic alkyl or fluorinated alkyl groups of 1 to 20 carbon atoms, $R^3$ is an acid labile group or a fluorinated alkyl group, both as described above, $R^{18}$ and $R^{19}$ are hydrogen, methyl or $CH_2CO_2R^{21}$, $R^{20}$ is a single bond or straight, branched or cyclic alkylene or fluorinated alkylene group of 1 to 20 carbon atoms, and $R^{21}$ is a straight, branched or cyclic alkyl group of 1 to 20 carbon atoms.

In the polymers of the invention, recurring units of the following formulae (49) to (57) may be introduced in addition to the above-described units for the purpose of further improving adhesion.

(49)
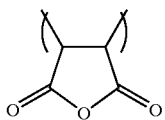

(50)
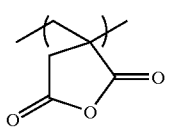

(51)
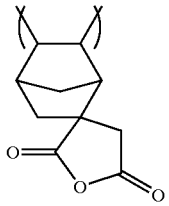

(52)
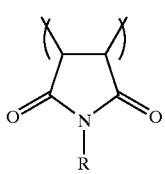

(53)
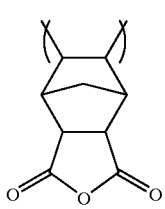

-continued

(54)
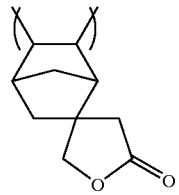

(55)
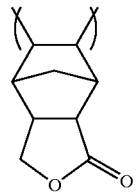

(56)
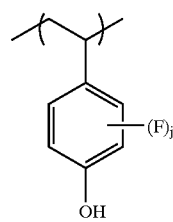

(57)
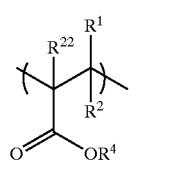

Herein, R, $R^1$, $R^2$, and $R^{22}$ are hydrogen, fluorine or straight, branched or cyclic alkyl or fluorinated alkyl groups of 1 to 20 carbon atoms, $R^4$ is an adhesive group as described above, and j is an integer of 0 to 4.

As indicated above, the invention requires that the polymer contain recurring units of at least one of formulae (1a), (1b) and (1c) below.

(1a)
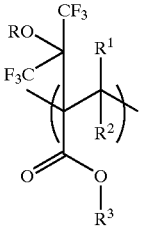

(1b)
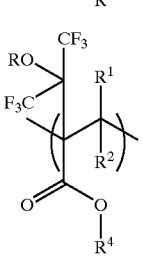

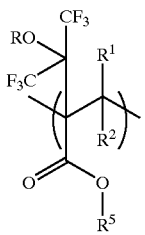
(1c)

The polymer of the invention should preferably contain at least 5 mol %, more preferably at least 10 mol %, and especially at least 30 mol % of units of formulae (1a) to (1c). When additional units are contained, the contents of additional units may be selected as appropriate.

Desirably the polymer has a weight average molecular weight of about 1,000 to about 1,000,000, and especially about 2,000 to about 100,000.

It is understood that the polymer of the invention may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

The polymer of the invention is generally synthesized by mixing monomers corresponding to the respective units of formulae (1a) to (1c) and optionally, monomers corresponding to the respective units of formulae (1')-1 to (1')-5 and monomers corresponding to the respective units of formulae (49) to (57) with a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for polymerization the polymer of the invention are radical polymerization of triggering polymerization with radicals of 2,2'-azobisisobutyronitrile (AIBN) or the like, and ion (anion) polymerization using catalysts such as alkyl lithium. The polymerization reaction can be effected in a conventional way.

The radical polymerization initiator used herein is not critical. Exemplary initiators include azo compounds such as 2,2'-azobis(4-methoxy-2,4-dimethylvaleronitrile), 2,2'-azobis(2,4-dimethylvaleronitrile), 2,2'-azobisisobutyronitrile, and 2,2'-azobis(2,4,4-trimethylpentane); and peroxide compounds such as t-butylperoxypivalate, lauroyl peroxide, benzoyl peroxide and t-butylperoxylaurate. Water-soluble initiators include inorganic initiators, for example, persulfate salts such as potassium persulfate, hydrogen peroxide, redox combinations of persulfate or hydrogen peroxide with a reducing agent such as sodium hydrogen sulfite or sodium thiosulfate, and systems in which any of the redox combinations and a minor amount of iron, ferrous salt or silver nitrate are co-present; and organic initiators, for example, dibasic acid compounds such as disuccinic peroxide, diglutaric peroxide and monosuccinic peroxide as well as azobisisobutylamidine dibasic acid salt. The amount of the polymerization initiator used is determined as appropriate in accordance with such factors as the identity of initiator and polymerization conditions, although the amount is often in the range of about 0.001 to 5% by weight, especially about 0.01 to 1% by weight based on the total weight of monomers to be polymerized.

For the polymerization reaction, a solvent may be used. The polymerization solvent used herein is preferably one which does not interfere with the polymerization reaction. Typical solvents include ester solvents such as ethyl acetate and n-butyl acetate, ketone solvents such as acetone, methyl ethyl ketone and methyl isobutyl ketone, aliphatic or aromatic hydrocarbon solvents such as toluene, xylene and cyclohexane, alcohol solvents such as isopropyl alcohol and ethylene glycol monomethyl ether, and ether solvents such as diethyl ether, dioxane, and tetrahydrofuran. These solvents may be used alone or in admixture of two or more.

Further, any of well-known molecular weight modifiers such as dodecylmercaptan may be used in the polymerization system. The temperature of polymerization reaction varies in accordance with the identity of polymerization initiator and the boiling point of the solvent although it is often preferably in the range of about 20 to 200° C., and especially about 50 to 140° C. Any desired reactor or vessel may be used for the polymerization reaction.

From the solution or dispersion of the polymer thus obtained, the organic solvent or water serving as the reaction medium is removed by any of well-known techniques. Suitable techniques include, for example, re-precipitation followed by filtration, and heat distillation under vacuum.

The polymer of the invention can be used as a base resin in resist compositions, specifically chemical amplification type resist compositions, and especially chemical amplification type positive working resist compositions.

Resist Composition

In a preferred embodiment, the chemically amplified positive resist composition is defined as comprising (A) the polymer (base resin) defined above, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin (inventive polymer), photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and aromatic solvents such as benzene, toluene and xylene.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 1,1,1,3,3,3-hexafluoroisopropyl alcohol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutaryl-methyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol-1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluoro(butyltetrahydrofuran), perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

Component (C)

Suitable examples of the photoacid generator (C) include onium salts of general formula (58) below, diazomethane derivatives of formula (59), glyoxime derivatives of formula (60), β-ketosulfone derivatives, disulfone derivatives, nitrobenzylsulfonate derivatives, sulfonic acid ester derivatives, and imidoyl sulfonate derivatives.

$$(R^{23})_nM^+K^- \tag{58}$$

In the formula, $R^{23}$ is a straight, branched or cyclic alkyl of 1 to 12 carbon atoms, an aryl of 6 to 20 carbon atoms, or an aralkyl of 7 to 12 carbon atoms; $M^+$ is iodonium or sulfonium; $K^-$ is a non-nucleophilic counter-ion; and the letter n is 2 or 3.

Illustrative examples of alkyl groups represented by $R^{23}$ include methyl, ethyl, propyl, butyl, pentyl, 2-oxocyclopentyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

(59)

In the formula, $R^{24}$ and $R^{25}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{24}$ and $R^{25}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

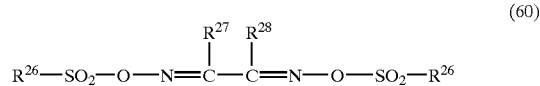
(60)

In the formula, $R^{26}$, $R^{27}$, and $R^{28}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{27}$ and $R^{28}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{26}$, $R^{27}$, and $R^{28}$ are exemplified by the same groups as mentioned above for $R^{24}$ and $R^{25}$. Examples of alkylene groups represented by $R^{27}$ and $R^{28}$ include methylene, ethylene, propylene, butylene, and hexylene.

Illustrative examples of the photoacid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl)-diazomethane, bis(p-toluenesulfonyl)diazomethane, bis-(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)-diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)-diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoximte, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)-diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight per 100 parts by weight of the base resin. At less than 0.2 part, the amount of acid generated during exposure would be too small and the sensitivity and resolution be poor, whereas the addition of more than 15 parts would lower the transmittance of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-isopropylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (61) and (62) may also be included.

(61)

(62)

In the formulas, $R^{29}$, $R^{30}$, $R^{31}$, $R^{35}$ and $R^{36}$ are independently straight, branched or cyclic alkylenes of 1 to 20 carbon atoms; $R^{32}$, $R^{33}$, $R^{34}$, $R^{37}$ and $R^{38}$ are hydrogen, alkyls of 1 to 20 carbon atoms, or amino; $R^{32}$ and $R^{33}$, $R^{32}$ and $R^{34}$, $R^{33}$ and $R^{34}$, $R^{32}$ with $R^{33}$ and $R^{34}$, and $R^{37}$ and $R^{38}$ may bond together to form rings; and n, o and p are each integers from 0 to 20, with the proviso that hydrogen is excluded from $R^{29}$, $R^{30}$, $R^{31}$, $R^{35}$ and $R^{36}$ when n, o and p are equal to 0.

The alkylene groups represented by $R^{29}$, $R^{30}$, $R^{31}$, $R^{35}$ and $R^{36}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{32}$, $R^{33}$, $R^{34}$, $R^{37}$ and $R^{38}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{32}$ and $R^{33}$, $R^{32}$ and $R^{34}$, $R^{33}$ and $R^{34}$, $R^{32}$ with $R^{33}$ and $R^{34}$, and $R^{37}$ and $R^{38}$ form rings, the rings preferably have 1 to 20 carbon atoms, more preferably 1 to 8 carbon atoms, and most preferably 1 to 6 carbon atoms, and may have pendant alkyl groups of 1 to 6 carbon atoms, and especially 1 to 4 carbon atoms.

Subscripts n, o, and p are each integers from 0 to 20, preferably from 1 to 10, and more preferably from 1 to 8.

Illustrative examples of the compounds of formulas (61) and (62) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of the base resin. At less than 0.01 part, the desired effects of the basic compound would not be apparent, while the use of more than 2 parts would result in too low a resolution and sensitivity.

Component (E)

The dissolution inhibitor (E) is a compound with a molecular weight of up to 3,000 which changes its solubility in an alkaline developer under the-action of an acid. Typically, a compound obtained by partially or entirely substituting acid labile substituents on a phenol or carboxylic acid derivative having a molecular weight of up to 2,500 is added as the dissolution inhibitor. The acid labile groups may be either fluorinated ones contemplated herein or conventional fluorine-free ones.

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl)-valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)-ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis-(2,6-difluorophenol), 2,6-bis[(2-hydroxy-5-fluorophenyl)-methyl]-4-fluorophenol, 2,6-bis[(4-hydroxy-3-fluorophenyl)-methyl]-4-fluorophenol, and 2,4-bis[(3-hydroxy-4-hydroxyphenyl)methyl]-6-methylphenol. The acid labile substituents are the same as above formulae (2) to (4).

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)-ethylidene]bisphenol-4,4'-di-t-butoxycarbonyl, bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)-methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1n-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)-ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (E) is up to about 20 parts, and especially up to about 15 parts by weight per 100 parts by weight of the solids in the composition. With more than 20 parts of the dissolution inhibitor, the resist composition becomes less heat resistant because of an increased content of monomer components.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Florade FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-

093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), F$_2$ excimer laser (157 nm), Kr$_2$ excimer laser (146 nm), KrAr excimer laser (134 nm) or Ar$_2$ excimer laser (126 nm), x-rays, or an electron beam. The desired pattern may not be obtainable outside the upper and lower limits of the above range.

The resist composition comprising the polymer of the invention is sensitive to high-energy radiation, has excellent sensitivity and resolution at a wavelength of less than 200 nm, especially less than 170 nm, and significantly improved substrate adhesion and alkali developability due to hexafluoroisopropanol units introduced. Because these features of the inventive resist composition enable its use particularly as a resist having a low absorption at the exposure wavelength of a F$_2$ excimer laser, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation. The abbreviations used herein are AIBN for 2,2'-azobisisobutyronitrile, GPC for gel permeation chromatography, NMR for nuclear magnetic resonance, Mw for weight average molecular weight, and Mn for number average molecular weight.

Synthesis Example 1

Copolymerization of Monomers 1 and 2 (1:1)

In a 500-ml flask, 13.3 g of Monomer 1 and 6.7 g of Monomer 2 shown below were dissolved in 100 ml of toluene. The system was fully purged of oxygen, 0.52 g of the initiator AIBN was added, and the system was heated at 60° C. at which polymerization reaction took place for 24 hours.

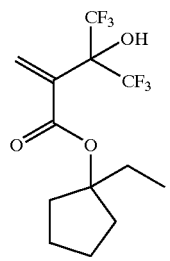

Monomer 1

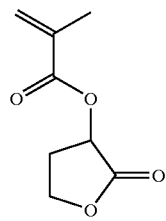

Monomer 2

The polymer thus obtained was purified by pouring the reaction mixture into hexane whereupon the polymer precipitated. The polymer collected was dissolved in tetrahydrofuran and poured into 5 liters of hexane for precipitation. This procedure was repeated twice. The polymer was separated and dried. There was obtained 14.9 g of a white polymer A, which was found to have a Mw of 8,700 as measured by the light scattering method, and a dispersity (Mw/Mn) of 1.67 as determined from the GPC elution curve. On $^1$H-NMR analysis, the polymer was found to consist of Monomer 1 and Monomer 2 in a ratio of 0.53:0.47.

Synthesis Example 2

Copolymerization of Monomers 3 and 2 (1:1)

In a 500-ml flask, 13.6 g of Monomer 3 shown below and 6.4 g of Monomer 2 were dissolved in 100 ml of toluene. The system was fully purged of oxygen, 0.49 g of the initiator AIBN was added, and the system was heated at 60° C. at which polymerization reaction took place for 24 hours.

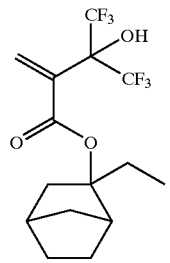

Monomer 3

The polymer thus obtained was purified by pouring the reaction mixture into hexane whereupon the polymer precipitated. The polymer collected was dissolved in tetrahydrofuran and poured into 5 liters of hexane for precipitation. This procedure was repeated twice. The polymer was separated and dried. There was obtained 14.2 g of a white polymer (B), which was found to have a Mw of 9,100 as measured by the light scattering method, and a dispersity (Mw/Mn) of 1.76 as determined from the GPC elution curve. On $^1$H-NMR analysis, the polymer was found to consist of Monomer 3 and Monomer 2 in a ratio of 0.54:0.46.

Synthesis Example 3

Copolymerization of Monomers 4 and 2 (1:1)

In a 500-ml flask, 14.0 g of Monomer 4 shown below and 6.0 g of Monomer 2 were dissolved in 100 ml of toluene. The system was fully purged of oxygen, 0.77 g of the initiator AIBN was added, and the system was heated at 60° C. at which polymerization reaction took place for 24 hours.

Monomer 4

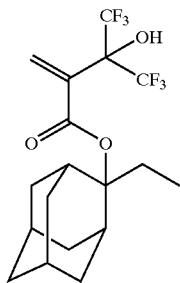

The polymer thus obtained was purified by pouring the reaction mixture into hexane whereupon the polymer precipitated. The polymer collected was dissolved in tetrahydrofuran and poured into 5 liters of hexane for precipitation. This procedure was repeated twice. The polymer was separated and dried. There was obtained 14.5 g of a white polymer (C), which was found to have a Mw of 9,300 as measured by the light scattering method, and a dispersity (Mw/Mn) of 1.62 as determined from the GPC elution curve. On $^1$H-NMR analysis, the polymer was found to consist of Monomer 4 and Monomer 2 in a ratio of 0.53:0.47.

Synthesis Example 4

Copolymerization of Monomers 3, 2 and 5 (1:1:0.5)

In a 500-ml flask, 13.6 g of Monomer 3, 6.4 g of Monomer 2 and 3.8 g of Monomer 5 shown below were dissolved in 100 ml of toluene. The system was fully purged of oxygen, 0.53 g of the initiator AIBN was added, and the system was heated at 60° C. at which polymerization reaction took place for 24 hours.

Monomer 5

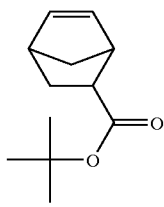

The polymer thus obtained was purified by pouring the reaction mixture into hexane whereupon the polymer precipitated. The polymer collected was dissolved in tetrahydrofuran and poured into 5 liters of hexane for precipitation. This procedure was repeated twice. The polymer was separated and dried. There was obtained 16.2 g of a white polymer (D), which was found to have a Mw of 4,900 as measured by the light scattering method, and a dispersity (Mw/Mn) of 2.01 as determined from the GPC elution curve. On $^1$H-NMR analysis, the polymer was found to consist of Monomer 3, Monomer 2 and Monomer 5 in a ratio of 0.40:0.39:0.21.

Synthesis Example 5

Copolymerization of Monomers 3 and 5 and Maleic Anhydride (0.25:1:1)

In a 500-ml flask, 6.0 g of Monomer 3, 18.0 g of Monomer 5 and 9.8 g of maleic anhydride were dissolved in 30 ml of tetrahydrofuran. The system was fully purged of oxygen, 0.53 g of the initiator AIBN was added, and the system was heated at 60° C. at which polymerization reaction took place for 24 hours.

The polymer thus obtained was purified by pouring the reaction mixture into hexane whereupon the polymer precipitated. The polymer collected was dissolved in tetrahydrofuran and poured into 5 liters of hexane for precipitation. This procedure was repeated twice. The polymer was separated and dried. There was obtained 18.2 g of a white polymer (E), which was found to have a Mw of 4,200 as measured by the light scattering method, and a dispersity (Mw/Mn) of 1.89 as determined from the GPC elution curve. On $^1$H-NMR analysis, the polymer was found to consist of Monomer 3, Monomer 5 and maleic anhydride in a ratio of 0.10:0.46:0.44.

Synthesis Example 6

Copolymerization of Monomers 4, 6 and 7 (1:1:0.25)

In a 500-ml flask, 20.0 g of Monomer 4, 16.1 g of Monomer 6 and 4.8 g of Monomer 7 shown below were dissolved in 100 ml of toluene. The system was fully purged of oxygen, 0.74 g of the initiator AIBN was added, and the system was heated at 60° C. at which polymerization reaction took place for 24 hours.

Monomer 6

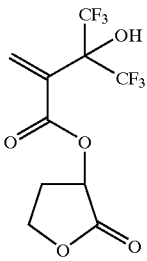

Monomer 7

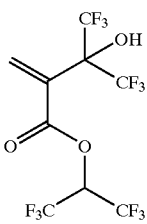

The polymer thus obtained was purified by pouring the reaction mixture into hexane whereupon the polymer precipitated. The polymer collected was dissolved in tetrahydrofuran and poured into 5 liters of hexane for precipitation. This procedure was repeated twice. The polymer was separated and dried. There was obtained 26.8 g of a white polymer (F), which was found to have a Mw of 8,900 as measured by the light scattering method, and a dispersity (Mw/Mn) of 1.78 as determined from the GPC elution curve. On $^1$H-NMR analysis, the polymer was found to consist of Monomer 4, Monomer 6 and Monomer 7 in a ratio of 0.44:0.46:0.10.

Synthesis Example 7

Polymerization of Monomer 8 and Synthesis of polymer having some hydroxyl groups protected In a 500-ml-flask, 37.4 g of Monomer 8 shown below was dissolved in 80 ml of toluene. The system was fully purged of oxygen, 0.66 g of the initiator AIBN was added, and the system was heated at 60° C. at which polymerization reaction took place for 24 hours.

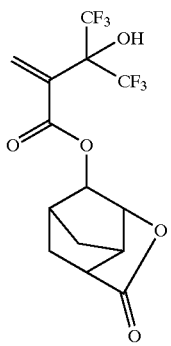

Monomer 8

The polymer thus obtained was purified by pouring the reaction mixture into hexane whereupon the polymer precipitated. The polymer collected was dissolved in tetrahydrofuran and poured into 5 liters of hexane for precipitation. This procedure was repeated twice. The polymer was separated and dried. There was obtained 28.6 g of a white polymer, which was found to have a Mw of 8,900 as measured by the light scattering method, and a dispersity (Mw/Mn) of 1.69 as determined from the GPC elution curve.

In 80 g of tetrahydrofuran were dissolved 20.0 g of the polymer and 0.96 g of ethyl vinyl ether. With 0.20 g of methanesulfonic acid added, reaction was effected at room temperature for 2 hours. Thereafter, an excess of triethylamine was added to the reaction mixture to stop reaction. The reaction mixture was poured into hexane whereupon the resulting polymer precipitated. The polymer collected was dissolved in tetrahydrofuran and poured into 5 liters of hexane for precipitation. This procedure was repeated twice. The polymer was separated and dried. There was obtained 17.2 g of a white polymer (G). On NMR analysis of the polymer, it was found that 20% of the hydroxyl groups were protected with ethoxyethyl.

Synthesis Example 8

Copolymerization of Monomers 7 and 9 (1:1)

In a 500-ml flask, 25.3 g of Monomer 7 and 12.4 g of Monomer 9 shown below were dissolved in 100 ml of toluene. The system was fully purged of oxygen, 0.76 g of the initiator AIBN was added, and the system was heated at 60° C. at which polymerization reaction took place for 24 hours.

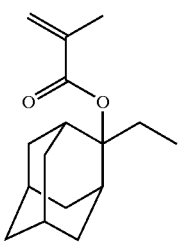

Monomer 9

The polymer thus obtained was purified by pouring the reaction mixture into hexane whereupon the polymer precipitated. The polymer collected was dissolved in tetrahydrofuran and poured into 5 liters of hexane for precipitation. This procedure was repeated twice. The polymer was separated and dried. There was obtained 30.2 g of a white polymer (H), which was found to have a Mw of 9,800 as measured by the light scattering method, and a dispersity (Mw/Mn) of 1.66 as determined from the GPC elution curve. On $^1$H-NMR analysis, the polymer was found to consist of Monomer 7 and Monomer 9 in a ratio of 0.49:0.51.

Synthesis Example 9

Copolymerization of Monomers 1 and 2 and 1,1,1,3,3,3-hexafluoroisopropyl methacrylate (1:1:0.5)

In a 500-ml flask, 10.8 g of Monomer 1, 5.4 g of Monomer 2 and 3.8 g of 1,1,1,3,3,3-hexafluoroisopropyl methacrylate were dissolved in 100 ml of methyl isobutyl ketone. The system was fully purged of oxygen, 0.56 g of the initiator t-butyl peroxypivalate was added, and the system was heated at 60° C. at which polymerization reaction took place for 24 hours.

The polymer thus obtained was purified by pouring the reaction mixture into hexane whereupon the polymer precipitated. The polymer collected was dissolved in tetrahydrofuran and poured into 5 liters of hexane for precipitation. This procedure was repeated twice. The polymer was separated and dried. There was obtained 14.6 g of a white polymer (I), which was found to have a Mw of 8,600 as measured by the light scattering method, and a dispersity (Mw/Mn) of 1.66 as determined from the GPC elution curve. On $^1$H-NMR analysis, the polymer was found to consist of Monomer 1, Monomer 2 and 1,1,1,3,3,3-hexafluoroisopropyl methacrylate in a ratio of 0.41:0.42:0.17.

Comparative Polymers

A polymer, designated Comparative Polymer 1, was synthesized from a monodisperse polyhydroxystyrene having a molecular weight of 10,000 and a dispersity (Mw/Mn) of 1.10 by substituting tetrahydropyranyl groups for 30% of the hydroxyl groups.

Comparative Polymer 2 was poly(methyl methacrylate) having a molecular weight of 15,000 and a dispersity of 1.7. Comparative Polymer 3 was a novolac polymer having a meta/para ratio of 40/60, a molecular weight of 9,000 and a dispersity of 2.5.

The polymers obtained above were determined for transmittance.

Polymer transmittance measurement

Each polymer, 1 g, was thoroughly dissolved in 10 g of propylene glycol monomethyl ether acetate (PGMEA), and passed through a 0.2-μm filter, obtaining a polymer solution.

The polymer solution was spin coated onto a $MgF_2$ substrate and baked on a hot plate at 100° C. for 90 seconds, forming a polymer layer of 100 nm thick on the MgF$_2$ substrate. Using a vacuum ultraviolet spectrometer (VUV200S by Nihon Bunko K.K.), the polymer layer was measured for transmittance at 248 nm, 193 nm and 157 nm. The results are shown in Table 1.

TABLE 1

| | Transmittance (%) | | |
|---|---|---|---|
| | 248 nm | 193 nm | 157 nm |
| Polymer A | 93 | 90 | 51 |
| Polymer B | 92 | 90 | 52 |
| Polymer C | 92 | 90 | 49 |
| Polymer D | 92 | 90 | 47 |
| Polymer E | 93 | 87 | 43 |
| Polymer F | 92 | 90 | 53 |
| Polymer G | 92 | 89 | 55 |
| Polymer H | 92 | 90 | 52 |
| Polymer I | 94 | 91 | 58 |
| Comparative Polymer 1 | 90 | 5 | 15 |
| Comparative Polymer 2 | 91 | 80 | 12 |
| Comparative Polymer 3 | 82 | 6 | 17 |

Using the above polymers, chemically amplified positive resist compositions were prepared as follows.

EXAMPLES AND COMPARATIVE EXAMPLE

Resist solutions were prepared in a conventional manner by formulating the polymer, photoacid generator (PAG1 or PAG2), basic compound, dissolution inhibitor (DRI1) and solvent in the amounts shown in Table 2.

PAG1

PAG2

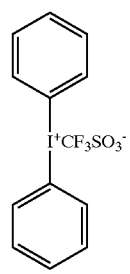

DRI1

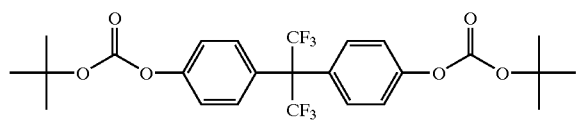

On silicon wafers, DUV-30 (Brewer Science) was coated to form films of 55 nm thick so that the reflectance to KrF light (248 nm) was reduced below 1%. On the coated substrates, the resist solutions were spin coated, then baked at 100° C. for 90 seconds on a hot plate to give resist films having a thickness of 300 nm.

The resist films were exposed stepwise by means of a KrF excimer laser stepper (NSR-2005 EX8A, from Nikon Corporation; NA 0.5, π 0.7, standard illumination) while varying the exposure dose in square areas of 4 mm×4 mm. Immediately after exposure, the resist films were baked at 110° C. for 90 seconds and then developed for 60 seconds with a 2.38% aqueous solution of tetramethylammonium hydroxide. The film thickness was measured in different dose areas. From the residual film thickness-to-dose relationship, the dose (Eth) giving a film thickness 0 was determined, which was regarded sensitivity. The results are shown in Table 2.

TABLE 2

| Polymer (pbw) | Photoacid generator (pbw) | Basic compound (pbw) | Dissolution inhibitor (pbw) | Solvent (pbw) | Eth (mJ/cm$^2$) |
|---|---|---|---|---|---|
| Polymer A (100) | PAG1 (2) | TBA (0.1) | — | PGMEA (1000) | 25 |
| Polymer B (100) | PAG1 (2) | TBA (0.1) | — | PGMEA (1000) | 20 |
| Polymer C (100) | PAG1 (2) | TBA (0.1) | — | PGMEA (1000) | 28 |
| Polymer D (100) | PAG1 (2) | TBA (0.1) | — | PGMEA (1000) | 30 |
| Polymer E (100) | PAG1 (2) | TBA (0.1) | — | PGMEA (1000) | 35 |
| Polymer F (100) | PAG1 (2) | TBA (0.1) | — | PGMEA (1000) | 22 |
| Polymer G (100) | PAG1 (2) | TBA (0.1) | — | PGMEA (1000) | 18 |
| Polymer H (100) | PAG1 (2) | TBA (0.1) | — | PGMEA (1000) | 33 |
| Polymer I (100) | PAG1 (2) | TBA (0.1) | — | PGMEA (1000) | 29 |
| Polymer F (100) | PAG1 (2) | TBA (0.1) | DRI1 (10) | PGMEA (1000) | 18 |
| Polymer F (100) | PAG2 (2) | TBA (0.1) | — | PGMEA (1000) | 15 |

As is evident from Table 1, polymers within the scope of the invention have satisfactory transparency at the wavelength of F$_2$ excimer laser (157 nm). As is evident from Table 2, resist compositions using polymers within the scope of the invention show the positive resist behavior in that upon KrF exposure, the film thickness decreases as the exposure dose increases.

Japanese Patent Application No. 2000-271234 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of at least one of the following general formulae (1a), (1b) and (1c):

(1a)

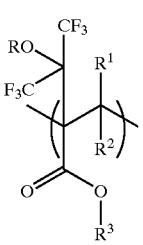

-continued

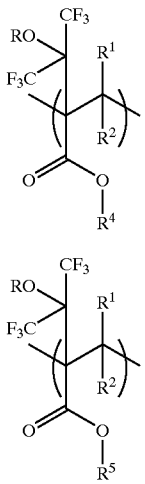

(1b)

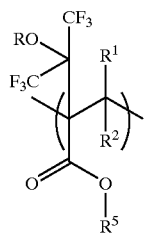

(1c)

wherein R is selected from the group consisting of hydrogen, an acid labile group, straight, branched or cyclic alkyl or fluorinated alkyl group of 1 to 20 carbon atoms, acyl group, and acyl group having a fluorinated alkyl moiety, $R^1$ and $R^2$ each are a hydrogen or fluorine atom, $R^3$ is an acid labile group, $R^4$ is an adhesive group, and $R^5$ is a straight, branched or cyclic alkyl or fluorinated alkyl group of 1 to 20 carbon atoms.

2. A resist composition comprising the polymer of claim 1.

3. A chemically amplified, positive resist composition comprising
   (A) the polymer of claim 1,
   (B) an organic solvent, and
   (C) a photoacid generator.

4. The resist composition of claim 3 further comprising (D) a basic compound.

5. The resist composition of claim 3 further comprising (E) a dissolution inhibitor.

6. A process for forming a resist pattern comprising the steps of:
   applying the resist composition of claim 2 onto a substrate to form a coating,
   heat treating the coating and then exposing it to high-energy radiation in a wavelength band of 110 to 180 nm or 1 to 30 nm through a photo mask, and
   optionally heat treating the exposed coating and developing it with a developer.

7. The pattern forming process of claim 6 wherein the high-energy radiation is an $F_2$ excimer laser beam, $Ar_2$ excimer laser beam or soft x-ray.

* * * * *